(12) United States Patent
Pasqualini

(10) Patent No.: US 6,977,420 B2
(45) Date of Patent: Dec. 20, 2005

(54) ESD PROTECTION CIRCUIT UTILIZING FLOATING LATERAL CLAMP DIODES

(75) Inventor: Ronald Pasqualini, Los Altos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/164,216

(22) Filed: Sep. 30, 1998

(65) Prior Publication Data

US 2001/0023962 A1 Sep. 27, 2001

(51) Int. Cl.[7] .............................. H01L 23/62; H02H 9/04
(52) U.S. Cl. ........................................ 257/355; 361/56
(58) Field of Search .............................. 257/355–363; 327/314, 320, 325; 361/56, 91, 111

(56) References Cited

U.S. PATENT DOCUMENTS

| | | | | |
|---|---|---|---|---|
| 5,239,440 A | | 8/1993 | Merrill ......................... | 361/91 |
| 5,515,225 A | * | 5/1996 | Gens et al. .................... | 361/56 |
| 5,744,842 A | * | 4/1998 | Keer ............................ | 257/362 |
| 5,770,886 A | * | 6/1998 | Rao et al. ..................... | 257/533 |
| 6,086,627 A | * | 7/2000 | Bass, Jr. et al. ................. | 716/5 |

* cited by examiner

Primary Examiner—Ori Nadav
(74) Attorney, Agent, or Firm—Mark C. Pickering

(57) ABSTRACT

A semiconductor chip is ESD protected, in part, by utilizing floating lateral clamp diodes. Unlike conventional clamp diodes, which are based upon parasitic bipolar devices associated with large MOS transistors, the floating lateral clamp diodes utilize a well formed in the substrate as the cathode, and a plurality of regions of the opposite conductivity type which are formed in the well as the anode.

38 Claims, 12 Drawing Sheets

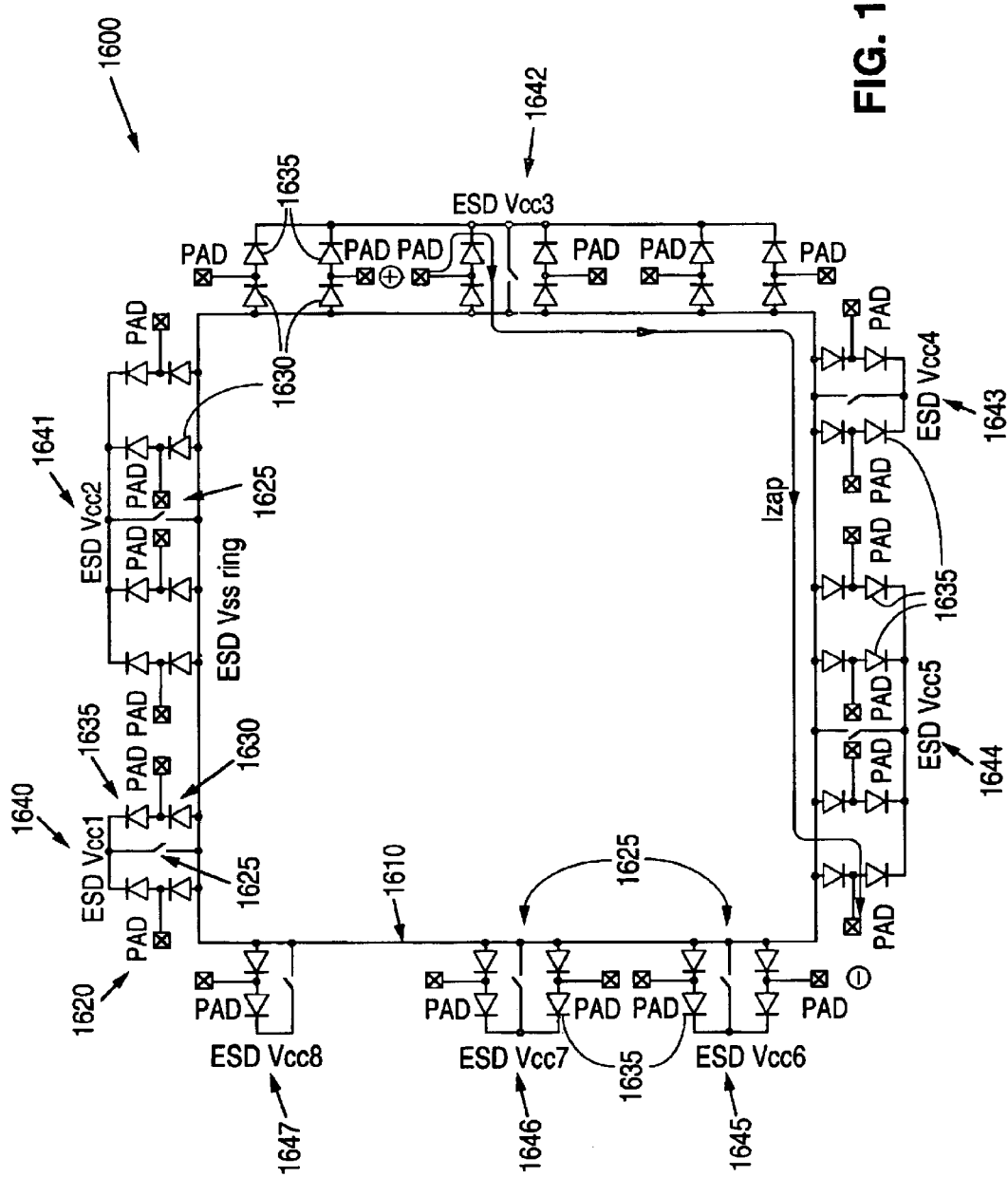

ESD PROTECTION CIRCUIT UTILIZING FLOATING LATERAL CLAMP DIODES

BACKGROUND OF THE INVENTION

1.0 Field of the Invention

The present invention relates to electrostatic discharge (ESD) protection circuits and, more particularly, to ESD protection circuits which utilize floating lateral clamp diodes.

2.0 Description of the Related Art

In recent years, increasing attention has been devoted to protecting packaged integrated circuits from damage which results from an electrostatic discharge (ESD) event. This has become increasingly important as the gate oxide thickness of MOS transistors has become thinner due to improved processing technologies which are now commonly in use.

An ESD event typically occurs when the packaged chip is exposed to static electricity, such as when the pins are touched by an ungrounded person handling the chip prior to installation, or when the chip slides across another surface on its pins.

FIGS. 1A and 1B show schematic diagrams which illustrate a portion of a conventional chip 100. As shown in FIGS. 1A and 1B, chip 100 includes a plurality of input/output (I/O) pins, such as first and second I/O pins 110 and 112, each of which is connected to the core of chip 100.

In operation, I/O pins 110 and 112 either receive signals that have been output by an external driver, such as driver 114, or output signals that have been received from an internal driver, such as internal driver 116.

As further shown in FIGS. 1A and 1B, chip 100 also includes a VCC wire 120 and a ground wire 122 which are both formed to completely encircle the periphery of chip 100. In addition, chip 100 further includes an ESD protection circuit which, in turn, includes a plurality of upper clamp diodes, such as diodes D1 and D3, and a plurality of lower clamp diodes, such as diodes D2 and D4.

Each upper clamp diode has an anode connected to an I/O pin, and a cathode connected to VCC wire 120. Similarly, each lower clamp diode has an anode connected to ground wire 122 and a cathode connected to an I/O pin. Furthermore, the ESD protection circuit also includes a plurality of ESD switches, such as ESD switch 130, which are connected to VCC wire 120 and ground wire 122.

As shown in FIG. 1A, when first I/O pin 110 is positively charged with respect to second I/O pin 112 in response to an ESD event, the resulting ESD current Izap flows from pin 110 through diode D1, ESD switch 130, and diode D4 to pin 112.

Similarly, as shown in FIG. 1B, when second I/O pin 112 is positively charged with respect to first I/O pin 110 in response to an ESD event, the resulting current Izap flows from pin 112 through diode D3, ESD switch 130, and diode D2 to pin 110.

In both of the aforementioned cases, the current Izap flows through ESD switch 130 in the same direction. Thus ESD switch 130 is conventionally a unidirectional switch.

FIG. 2 shows one possible embodiment of the ESD switch 130. As shown in FIG. 2, switch 130 includes a switch transistor 210, an inverter 212, and an RC circuit 214. Switch transistor 210 has a drain connected to VCC wire 120, a source connected to ground wire 122, and a gate.

Inverter 212, in turn, includes a p-channel transistor 220 that has a drain connected to the gate of transistor 210, a source connected to VCC wire 120, and a gate; and an n-channel transistor 222 that has a drain connected to the drain of transistor 220, a source connected to ground wire 122, and a gate connected to the gate of transistor 220.

Furthermore, RC circuit 214 includes a resistor R which is connected to the gates of transistors 220 and 222, and to VCC wire 120; and a capacitor C which is connected to resistor R, and to ground wire 122.

In operation, the values for R and C must be chosen such that the RC time constant will be long with respect to an ESD event (approximately 5–25 ns), and short with respect to the power supply rise time (which cannot be faster than 4 ms, assuming a 60 Hz AC line). This restriction will insure that switch transistor 210 will turn on during an ESD event, but will not turn on when the power supply is initially applied.

FIG. 3 shows a schematic diagram which illustrates how the upper and lower clamp diodes D1 and D2 were implemented using the prior art. As shown in FIG. 3, clamp diodes D1 and D2 are made from a pair of parasitic lateral bipolar transistors Q1 and Q2 that are associated with a pair of very large p-channel and n-channel CMOS devices M1 and M2. The bipolar transistors Q1 and Q2 are configured with their bases connected to their collectors in order to form the required upper and lower clamp diodes D1 and D2.

3.0 ESD Diode Requirements

In order to provide adequate ESD protection, clamp diodes D1 and D2 must have a very low forward voltage drop. This implies that diodes D1 and D2 must have a very low forward resistance (approximately 1–2 ohms) since diodes D1 and D2 must conduct a very high forward current (approximately 1.3 A–2.0 A) during an ESD event.

4.0 Disadvantages of the Prior Art

The primary disadvantages of the prior art are discussed below.

4.1 Large Chip Area, High Pin Capacitance and High Input Leakage

In order to meet stringent ESD diode requirements, CMOS transistors M1 and M2 in FIG. 3 must be made very large. This large size, in turn, has three disadvantages. First, large CMOS transistors consume more silicon real estate than smaller CMOS transistors and, therefore, increase the die area required.

Second, large CMOS transistors connected to I/O pins, such as transistors M1 and M2, increase the pin capacitance to approximately 6–12 pF, a significant disadvantage (especially for switchable high-impedance bus pins, such as TRI-STATE™ pins). Third, the large pn junction periphery/area present in large CMOS transistors also increases the input leakage current.

4.2 No ESD Protection For Floating Ground Lines on Mixed Signal Chips

Another serious disadvantage to forming clamp diodes D1 and D2 from parasitic bipolar devices relates to the design of mixed-signal (analog/digital) chips. FIG. 4 shows a schematic diagram which illustrates a portion of a conventional mixed-signal chip 400.

As illustrated by chip 400 in FIG. 4, mixed signal chips usually contain multiple ground lines. These ground lines can be broadly classified as dirty ground lines DGL, clean ground lines CGL, analog ground lines AGL, and substrate ground lines SGL.

Dirty ground lines only service the noisy (high di/dt) digital output buffers. Dirty ground lines are so named because high di/dt output buffers can generate significant ground bounce (switching noise) when multiple output drivers discharge their load capacitances on the same ground line at the same time.

FIG. 5 shows a circuit diagram which illustrates a portion of an output circuit 500. As shown in FIG. 5, output circuit 500 includes a common ground line 510, and a series of output drivers driver#1–driver#N which are each connected to common ground line 510.

During normal operation, when a single output driver is switched from a logic high to a logic low, a time varying discharge current $i(t)_D$ is placed on ground line 510. Similarly, when each of the output drivers driver#1–driver#N simultaneously switches from a logic high to a logic low, a large time varying current is placed on ground line 510.

The large time varying current, which is the sum of the individual time varying currents $i(t)_D$, causes the voltage on ground line 510 to also vary due to the inductance of ground line 510 (which is shown as an inductor L). As shown in EQ. 1, the voltage variation VLG on ground line 510 is defined as follows:

$$VLG = L*N(di(t)/dt) \qquad \text{EQ. 1}$$

where L represents the inductance of ground wire 510 (including package inductance and bondwire inductance), N represents the number of drivers driver#1–driver#N that are discharged at the same time, and $di(t)/dt$ represents the time varying discharge current $i(t)_D$ of a single driver.

Thus, as shown in FIG. 5, an extremely high ground bounce (switching noise) can be generated when several drivers driver#1–driver#N switch from a logic high level to a logic low level at the same time.

Clean ground lines usually service the relatively quiet (low di/dt) internal standard cells and/or digital macro cells. Depending upon the analog signal levels involved, the clean ground lines may or may not be connected to the ground lines which service the analog blocks.

In order to keep substrate noise to an absolute minimum, one or more substrate ground pads can be used. These pads should only be connected to the P-substrate, with as many substrate contacts as possible.

In order to minimize the amount of switching noise which is directly coupled into the substrate, the clean and dirty ground lines must be isolated from the substrate (i.e. not directly connected to it), and they must also be isolated from each other.

Since these on-chip ground lines are effectively floating with respect to the substrate, they cannot be ESD protected using clamp diodes formed from parasitic bipolar devices. The reason for this can be seen by examining FIG. 3.

As shown in the figure, the base of the parasitic NPN transistor Q2 is formed in the P-substrate. Since the base and collector of transistor Q2 must be connected together to form the anode of lower clamp diode D2, the anode of diode D2 must also be connected to the substrate.

This constraint makes it impossible to ESD protect the floating clean and dirty ground lines, since they are not directly connected to the substrate. This lack of ESD protection for the multiple ground lines on mixed signal chips is a major limitation.

4.3 High Forward Voltage Drop

There is another serious disadvantage to forming clamp diodes D1 and D2 from parasitic bipolar transistors—high forward voltage drop across the clamp diodes. The only way to mitigate this problem is to make the P-channel/N-channel CMOS devices (M1/M2 in FIG. 3) extremely large in size. As described above, however, large size wastes valuable chip area, increases pin capacitance (extremely bad for switchable high-impedance outputs, such as TRI-STATES™ outputs) and increases the leakage current at each pin.

The basic reasons for the high diode forward voltage drop can be seen by examining the equations which define the voltage drops VD1 and VD2 across diodes D1 and D2 in FIG. 3. As shown by EQ. 2, the forward voltage drop VD1, across upper clamp diode D1, is defined as follows:

$$VD1 = Vbe_{Q1} + (IC_{Q1}/B_{Q1})(RBP+RP) \qquad \text{EQ. 2}$$

where $Vbe_{Q1}$ is the base-emitter voltage of parasitic transistor Q1, $IC_{Q1}$ is the forward collector current of parasitic transistor Q1, $B_{Q1}$ is the beta of parasitic transistor Q1, RBP is the base resistance associated with the resistivity of the N-well, and RP is the base contact resistance due to aluminum/N-well contact.

Similarly, as shown by EQ. 3, the forward voltage drop VD2, across lower clamp diode D2, is defined as follows:

$$VD2 = Vbe_{Q2} + (IC_{Q2}/B_{Q2})(RBN+RN) \qquad \text{EQ. 3}$$

where $Vbe_{Q2}$ is the base-emitter voltage of parasitic transistor Q2, $IC_{Q2}$ is the forward collector current of parasitic transistor Q2, $B_{Q2}$ is the beta of parasitic transistor Q2, RBN is the base resistance associated with the resistivity of the p-substrate, and RN is the base contact resistance due to the aluminum/p-substrate contact.

In the prior art shown in FIG. 3, transistors Q1 and Q2 are implemented as lateral bipolar devices, which are known to have low betas at high collector current. Therefore, because high collector current flows during an ESD event, the betas of Q1 and Q2 will be low, thereby increasing the forward voltage drops VD1 and VD2 in the equivalent ESD protection diodes D1 and D2.

Furthermore, as shown in EQs. 2 and 3, the resistor values RBP and RBN must also be minimized in order to minimize the diode forward voltage drops VD1 and VD2. Since resistor values RBP and RBN are respectively associated with columns of N-well contacts and substrate contacts, the best way to minimize the resistance values of RBP and RBN would be to place the N-well contacts and substrate contacts directly on top of the bases of parasitic transistors Q1 and Q2. This cannot be done, however, because the bases are covered by the poly gates associated with MOS transistors M1 and M2. Thus, it is very difficult to make the resistance values RBP and RBN very low in value. The best that can be done is to place the associated N-well/substrate contacts as close as possible to the gates of MOS transistors M1 and M2. Increasing the number of N-well/substrate contact columns also helps, but significantly increases the area required to build the ESD protection diodes D1 and D2.

4.4 No ESD Protection For Multiple VCC Lines on Mixed Signal Chips

Another disadvantage of the ESD protection circuit shown in FIG. 3 is that it does not provide any means for ESD protecting the multiple, isolated VCC lines which are usually found on mixed-signal chips. FIG. 6 shows a schematic diagram which illustrates a conventional mixed-signal chip 600.

As illustrated by chip 600 in FIG. 6, these lines can be broadly classified as dirty VCC lines DVL, clean VCC lines CVL, and analog VCC lines AVL. Dirty VCC lines only service the noisy (high di/dt) digital output buffers because, as with the dirty ground lines, high di/dt buffers can generate significant VCC bounce (switching noise) when multiple output drivers turn on and charge their load capacitances at the same time.

FIG. 7 shows a circuit diagram which illustrates a portion of an output circuit 700. As shown in FIG. 7, output circuit 700 is similar to output circuit 500 and, as a result, utilizes the same reference numerals to designate the structures which are common to both circuits.

As further shown in FIG. 7, output drivers driver#1–driver#N are each connected to a common VCC line 710. During normal operation, when a single output driver switches from a logic low to a logic high, a time varying charge current $i(t)_c$ is placed on VCC line 710. Similarly, when each of the output drivers driver#1–driver#N simultaneously switches from a logic low to a logic high, a large time varying current is placed on VCC line 710.

The large time varying current, which is the sum of the individual time varying charge currents $i(t)_c$, causes the voltage on VCC line 710 to also vary due to the inductance of VCC line 710 (shown as inductor L). As shown by EQ. 4, the voltage variation VLV on VCC line 710 is defined as follows:

$$VLV = L*N(di(t)/dt) \qquad \text{EQ. 4}$$

where L represents the inductance of VCC wire 710 (including package inductance and bondwire inductance), N represents the number of drivers driver#1-driver#N which charge their load capacitance at the same time, and $di(t)/dt$ represents the time varying charge current $i(t)_c$.

Thus, as shown in FIG. 7, extremely high VCC bounce (switching noise) can be generated when several drivers driver#1–driver#N switch from a logic low to a logic high at the same time.

Clean VCC lines usually service the relatively quiet (low di/dt) internal standard cells and/or digital macro cells. Depending upon the analog signal levels involved, the clean VCC lines may or may not be connected to the VCC lines which service the analog blocks.

In order to minimize crosstalk between the clean and dirty VCC lines, these lines must be isolated from each other. Generally speaking, analog VCC lines should be isolated from the dirty/clean VCC lines, and sensitive analog VCC lines are usually isolated from each other. None of this is possible in the prior art because, as shown in FIG. 3, the cathode of diode D1 is connected to a common VCC line.

4.5 Reliability Issues with Respect to Thin Oxide

Yet another disadvantage of using large p-channel and n-channel MOS transistors to make ESD diodes, such as transistors M1 and M2 in FIG. 3, is that these transistors contain thin gate oxide. As a result, these transistors are much more prone to ESD damage in comparison to ESD diodes which do not contain any thin oxide.

4.6 Summary of Disadvantages of the Prior Art

From the foregoing discussion, it can be seen that the main disadvantages of the prior ESD art (as illustrated in FIG. 3) can be summarized as follows:

ESD protection of multiple isolated VCC lines and multiple isolated ground lines is not possible.

The method of forming ESD protection diodes, utilizing parasitic bipolar transistors, imposes the following disadvantages:

High forward voltage drop due to low beta and high equivalent base resistance

High leakage current due to large transistor size

High pin capacitance (especially bad for switchable high-impedance TRI-STATE™ outputs)

Low reliability (due to the presence of thin oxide in the ESD protection devices M1 and M2 in FIG. 3)

Common anode for all of the lower ESD protection diodes (as illustrated by diode D2 in FIG. 3)

Increased silicon area due to the large device sizes which are required

As implied by the above disadvantages, there is a great need for a more efficient ESD clamp diode, and a more flexible ESD clamping circuit. These items will now be discussed in the following paragraphs.

5.0 SUMMARY OF THE INVENTION

Conventionally, semiconductor chips are ESD protected, in part, by utilizing lateral clamp diodes which are based on the parasitic bipolar action of large MOS transistors. Large MOS transistors, which are formed in the substrate, present a number of problems which include the inability to ESD protect mixed-signal chips. In the present invention, all of the problems experienced with conventional diodes are overcome by using floating lateral clamp diodes.

In accordance with the present invention, an ESD protected chip, which has a substrate of a first conductivity type, includes a pad, an ESD positive ring (wire), and an ESD negative ring (wire). In addition, the chip further includes a plurality of floating lateral clamp diodes which are connected to the pad so that a first floating lateral clamp diode is connected to the pad and the positive ring, and a second floating lateral clamp diode is connected to the pad and the negative ring.

The floating lateral clamp diode, in turn, includes a well of a second conductivity type which is formed in the substrate. The well has a surface and a dopant concentration. The floating lateral clamp diode also includes a plurality of spaced-apart first regions of the first conductivity type. Each first region has a surface. The plurality of first regions are electrically connected together, and formed in the well so that the surface of the well encircles the surface of each first region.

A better understanding of the features and advantages of the present invention will be obtained by reference to the following detailed description and accompanying drawings which set forth an illustrative embodiment in which the principals of the invention are utilized.

6.0 BRIEF DESCRIPTION OF THE DRAWINGS

FIG. 16 is a circuit diagram illustrating a chip 1600 in accordance with an alternate embodiment of the present invention.

7.0 DESCRIPTION OF THE PRESENT INVENTION

Figure 8:
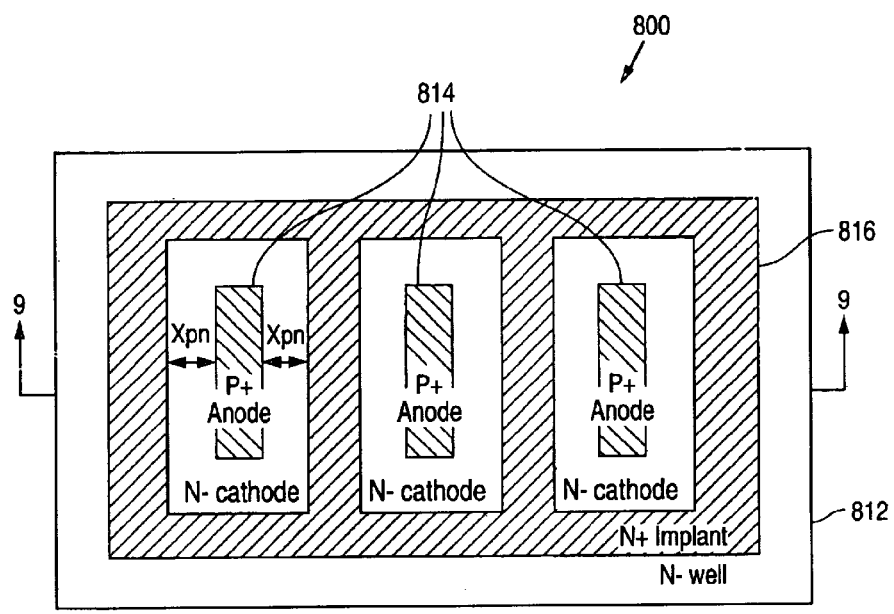
FIG. 8 is a plan view illustrating a floating, lateral, P+/N– ESD-protection diode 800 in accordance with the present invention.
Figure 9:
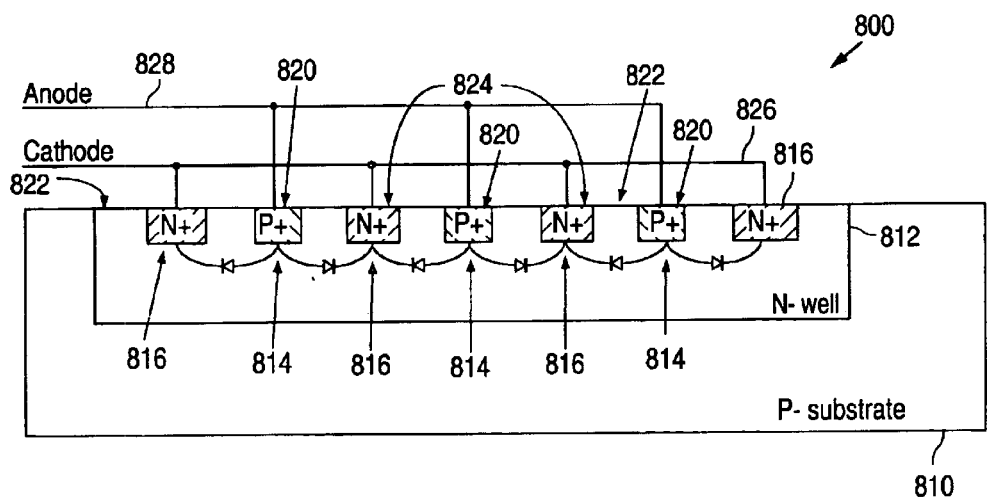
FIG. 9 shows a cross-sectional view of diode 800 taken along line 9—9 of FIG. 8.

FIG. 8 shows a plan view which illustrates a floating, lateral, P+/N− ESD-protection diode 800 in accordance with the present invention. FIG. 9 shows a cross-sectional view of diode 800 taken along line 9—9 of FIG. 8. As described in greater detail below, the present invention replaces the large lateral parasitic PNP/NPN transistors Q1 and Q2 of FIG. 3 with much smaller floating, lateral diodes. Floating lateral diodes in accordance with the present invention are defined as diodes that are not formed in the substrate, but are instead formed in wells or other structures which can be isolated from the substrate.

7.1 Lateral Diode Layout and Design

As shown in FIGS. 8 and 9, diode 800 includes an N-well 812 which is formed in a P-substrate 810, and a plurality of spaced-apart P+ implanted regions 814 which are formed in N-well 812. N-well 812 serves as the diode cathode, while P+ regions 814 serve as the diode anode.

As further shown, N+ contact region 816 is formed in N-well 812 so that the surface 820 of each P+ region 814 is surrounded by a surface region 822 of N-well 812 which, in turn, is surrounded by the surface 824 of N+ region 816. Contact to the cathode is made via N+ contact regions 816 inside N-well 812. In addition, a cathode line 826 is connected to the N+ regions 816, which provide a connection to the cathode. Similarly, anode line 828 is connected to each of the P+ regions 814.

As noted above, in order to provide adequate ESD protection, diode 800 must have a very low forward voltage drop. This implies that diode 800 must have a very low forward resistance (approximately 1–2 ohms), since diode 800 must conduct very high forward current (approximately 1.3 A–2.0 A) during an ESD event.

The forward resistance of floating, lateral, diode 800 is inversely proportional to the total periphery of all of the P+ implants 814 (or 'fingers') shown in FIG. 8. The forward resistance is also somewhat affected by the anode to cathode spacing Xpn, and the ohms per square of N-well 812 which is relatively high (approximately 1K ohms per square for a 'typical' 3V CMOS process).

Thus, the anode to cathode spacing Xpn should be made as small as possible in order to minimize the effect of the resistivity of N-well 812 on the forward resistance of diode 800. Of course, the anode to cathode spacing Xpn cannot be reduced to the point where the P+/N− diode junction will 'punch through' under normal operating conditions.

Figure 10:
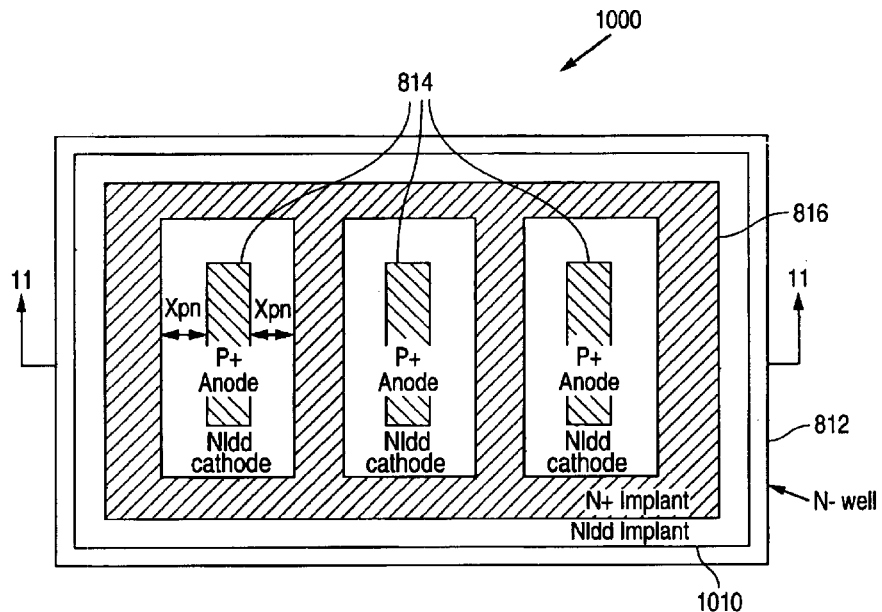
FIG. 10 is a plan view that illustrates a floating, lateral, P+/N– ESD-protection diode 1000 in accordance with an alternate embodiment of the present invention.
Figure 11:
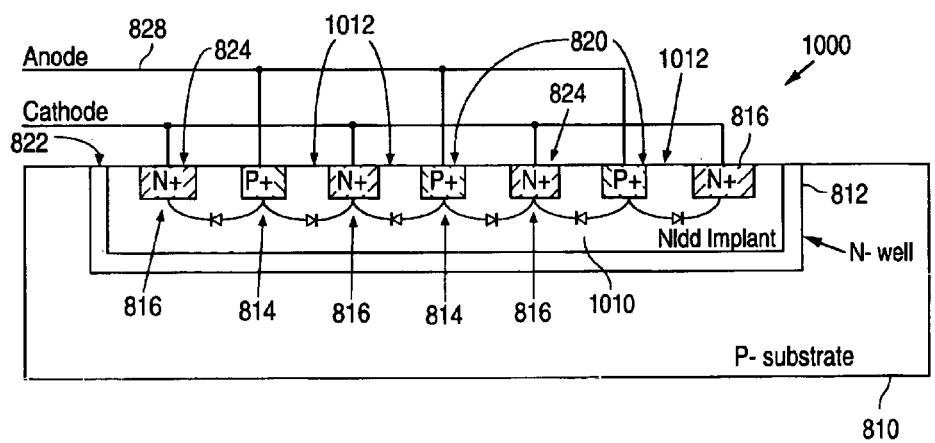
FIG. 11 is a cross-sectional diagram taken along line 11—11 of FIG. 10.

In addition, the forward resistance of floating lateral diode 800 can be further reduced by utilizing LDD regions. FIG. 10 shows a plan view which illustrates a floating, lateral, P+/N− ESD protection diode 1000 in accordance with an alternate embodiment of the present invention. FIG. 11 shows a cross-sectional diagram taken along line 11—11 of FIG. 10.

FIGS. 10 and 11 are similar to FIGS. 8 and 9 and, therefore, use the same reference numerals to designate the structures which are common to both diodes 800 and 1000.

As shown in FIGS. 10 and 11, the forward resistance of a floating lateral diode can be further reduced by forming an NLDD implanted region 1010 in N− well 812 so that P+ implanted regions 814 and N+ contact region 816 are formed in the NLDD region 1010. As a result, the surface 820 of each P+ region 814 is surrounded by a surface region 1012 of NLDD region 1010 which, in turn, is surrounded by the surface 824 of N+ region 816.

Thus, diode 1000 shown in FIGS. 10 and 11 is formed from P+/NLDD implants instead of from P+/N− well implants. Since the ohms per square value of the NLDD implant is less than that of the N-well implant, the forward resistance of diode 1000 is decreased. As with diode 800, diode 1000 in FIGS. 10 and 11 is still fabricated within N− well 812. This is very important because it allows diode 1000 to float, enabling ESD protection of mixed-signal CMOS chips.

Figure 12:
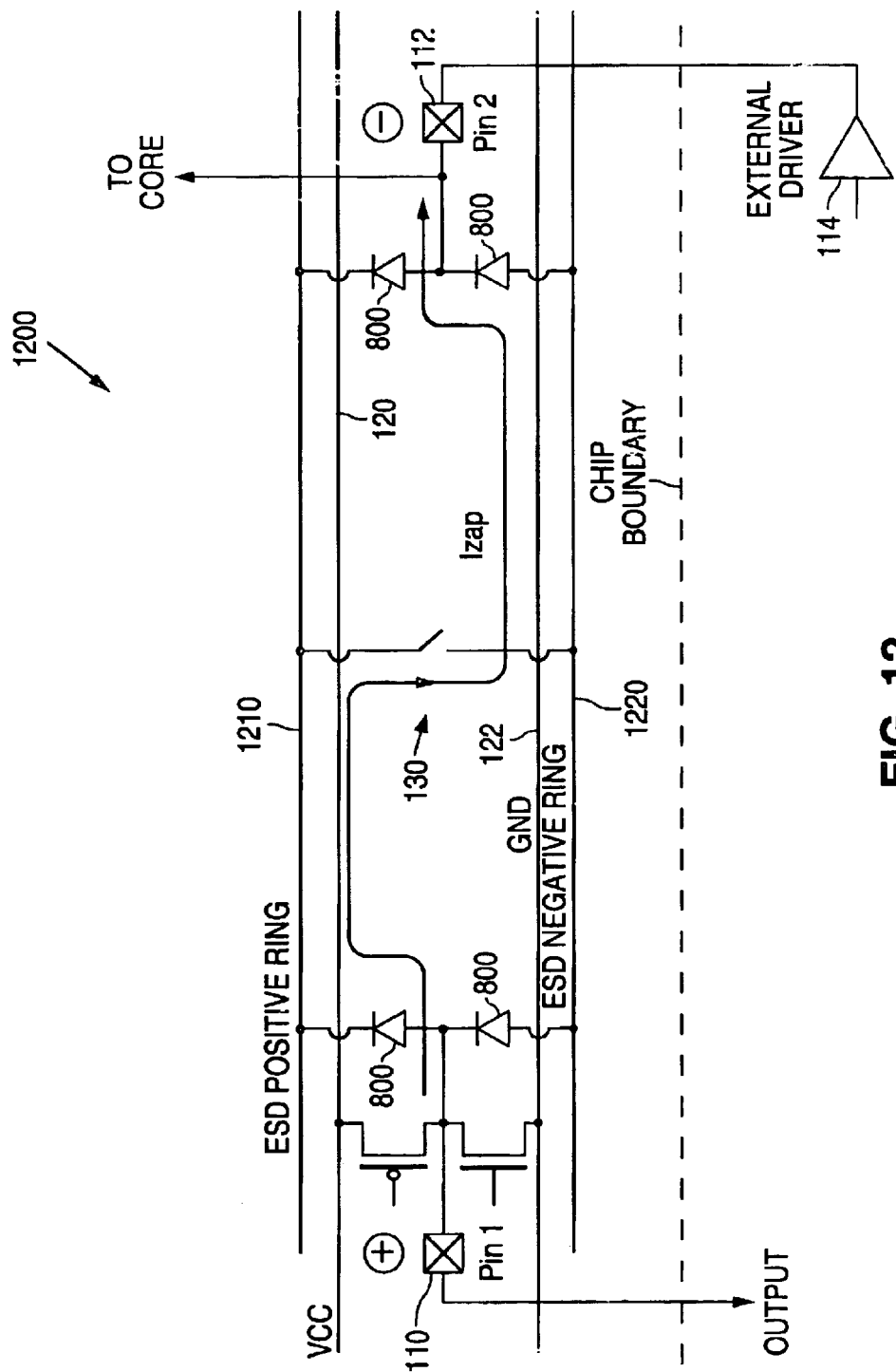
FIG. 12 is a schematic diagram illustrating a portion of a conventional chip 1200 in accordance with the present invention.

FIG. 12 shows a schematic diagram which illustrates a portion of a conventional chip 1200 in accordance with the present invention. Chip 1200 is similar to chip 100 and, as a result, utilizes the same reference numerals to designate the structures which are common to both chips.

Figure 1A:
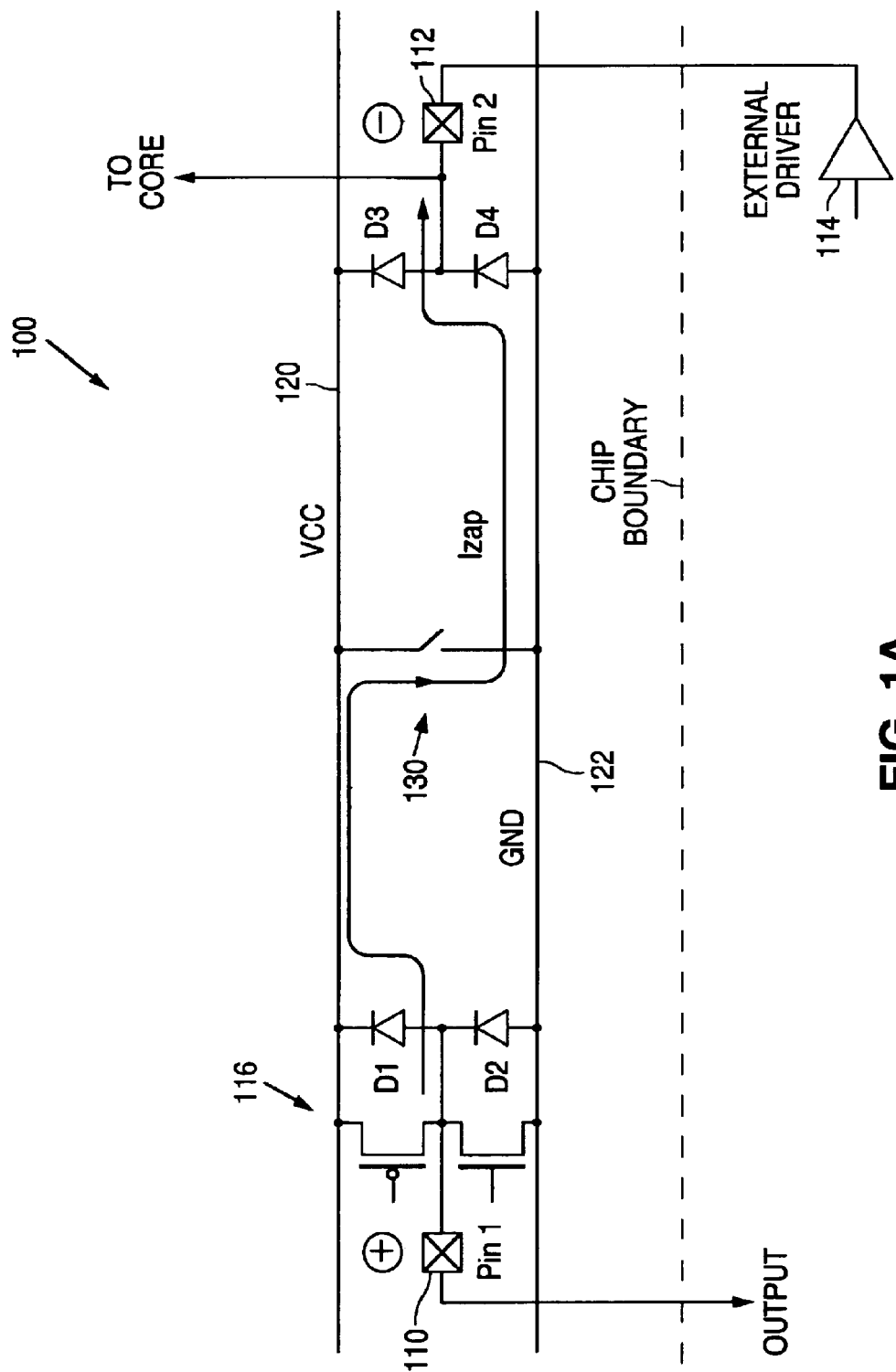
FIGS. 1A and 1B are schematic diagrams illustrating a portion of a conventional chip 100.
Figure 1B:
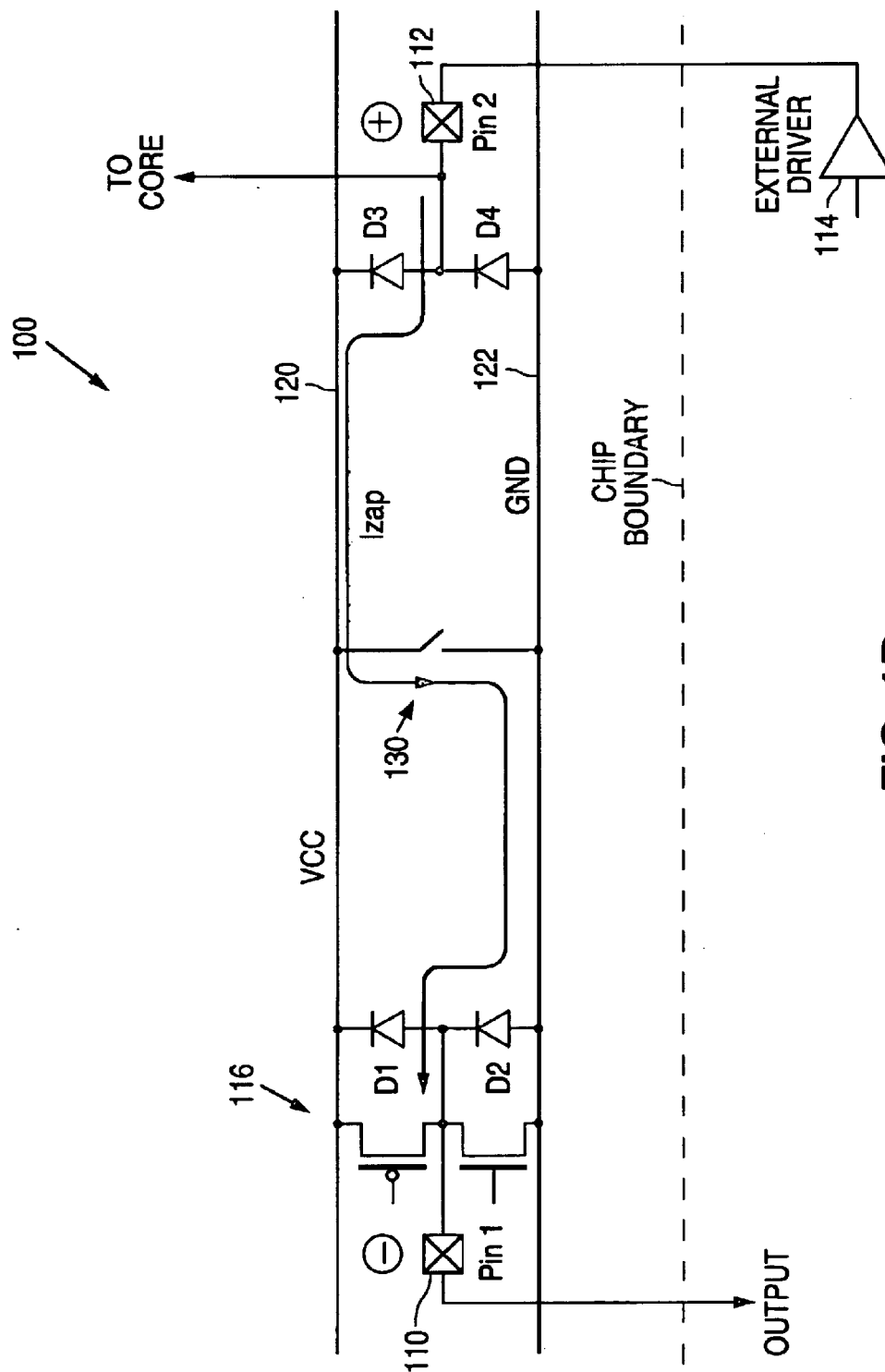

As shown in FIG. 12, chip 1200 differs from chip 100 in that chip 1200 utilizes diode 800 (or 1000) in lieu of diodes D1 and D2. In addition, diode 800 (or 1000) and switch 130 are connected to a positive ESD ring 1210 and a negative ESD ring 1220, instead of to the power supply wire 120 and the ground wire 122, as shown in FIGS. 1A and 1B for chip 100. Thus, by utilizing the current invention, chip 1200 provides ESD protection for all I/O pins, including multiple isolated power supplies and multiple isolated grounds. The prior art utilized by chip 100, as shown in FIGS. 1A and 1B, does not provide ESD protection for multiple isolated power supplies and multiple isolated grounds.

7.2 Lateral Diode Offers 4× Advantage in Terms of Resistance Per Unit Area

In comparison to lateral PNP/NPN transistors (M1 and M2 in FIG. 3), diodes 800 and 1000 provide a factor of 3 to 4 times improvement in the diode resistance vs diode area tradeoff (an extremely significant advantage).

Figure 3:
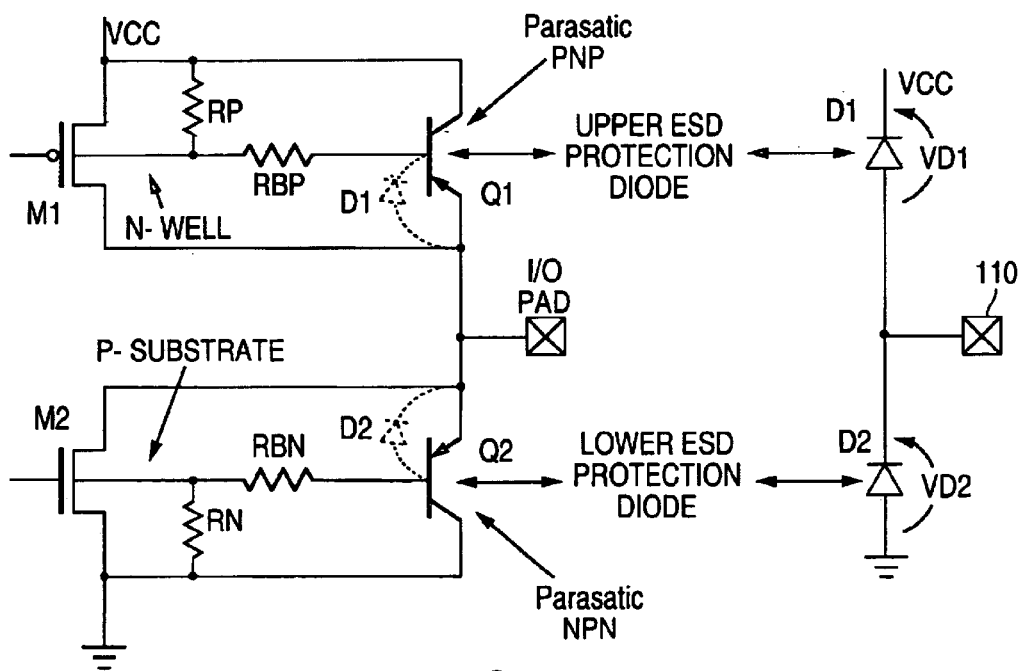
FIG. 3 is a schematic diagram illustrating upper and lower clamp diodes D1 and D2.
Figure 4:
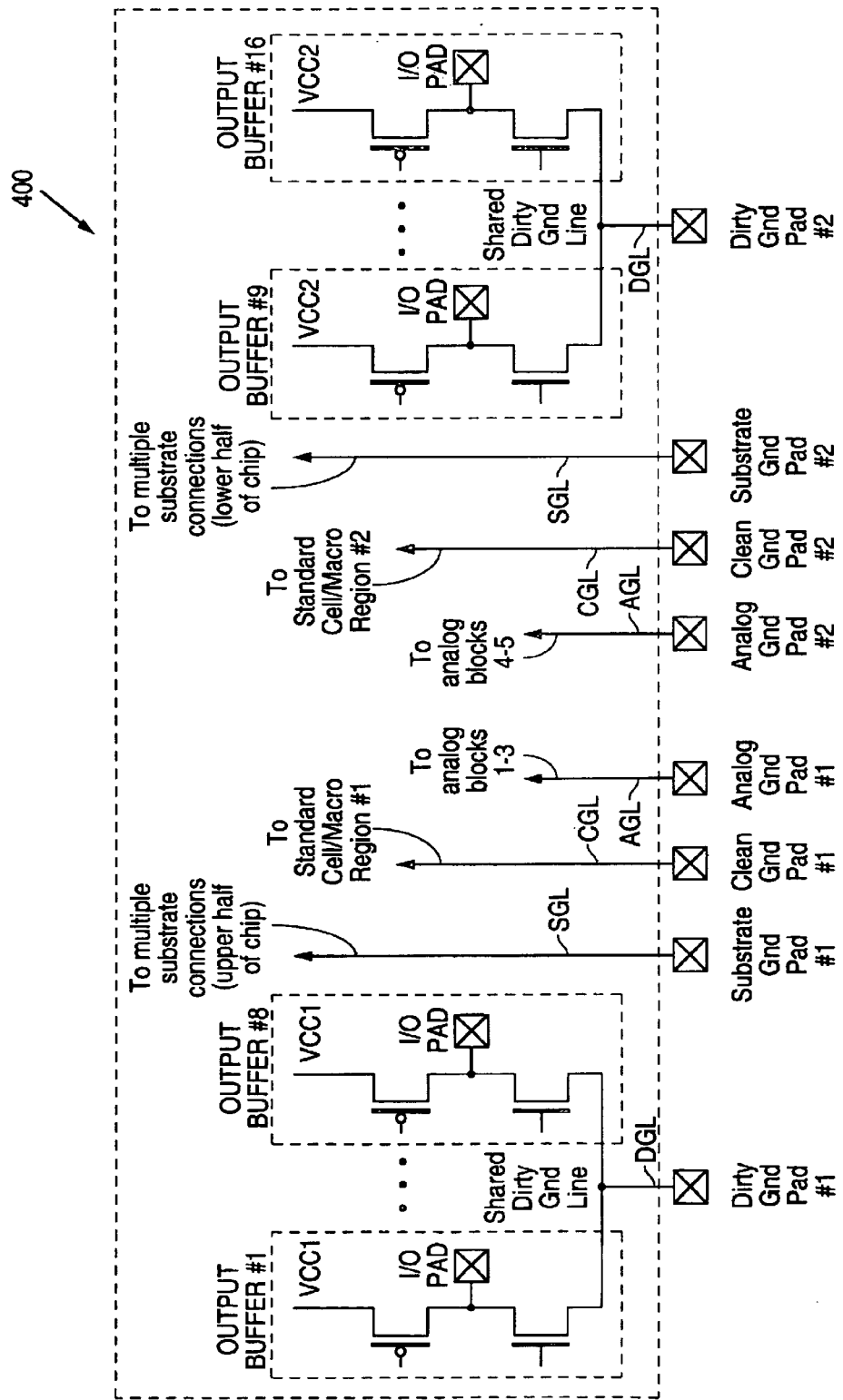
FIG. 4 is a schematic diagram illustrating a portion of a conventional mixed-signal chip 400.
Figure 5:
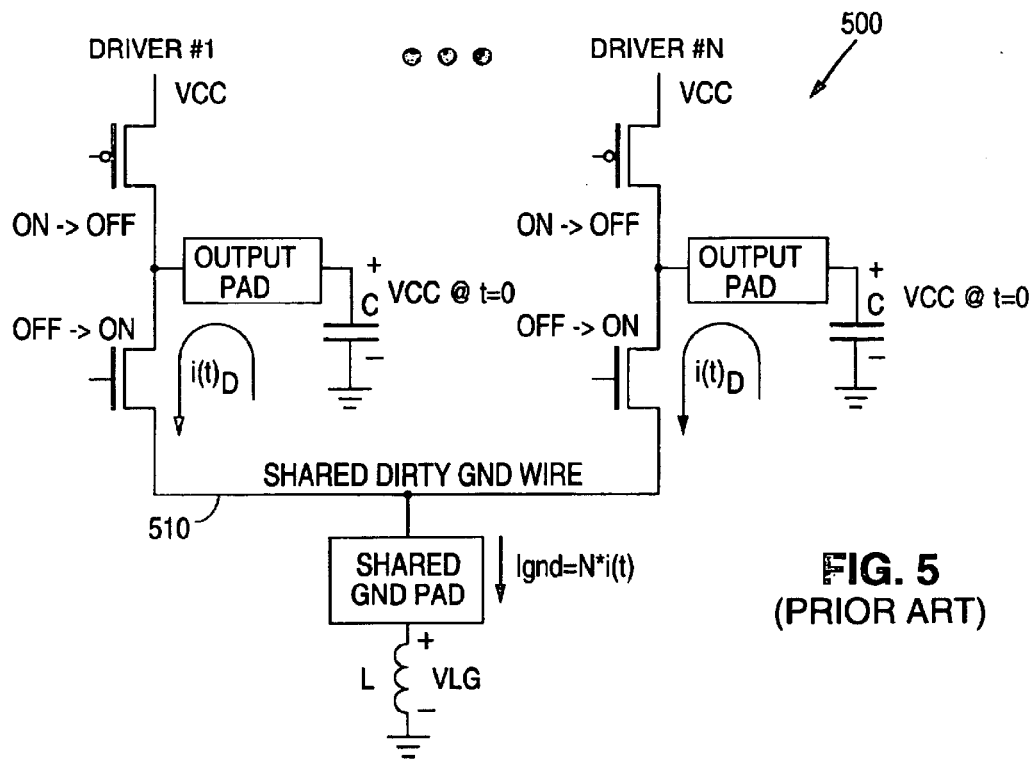
FIG. 5 is a circuit diagram illustrating a portion of a conventional output circuit 500.
Figure 7:
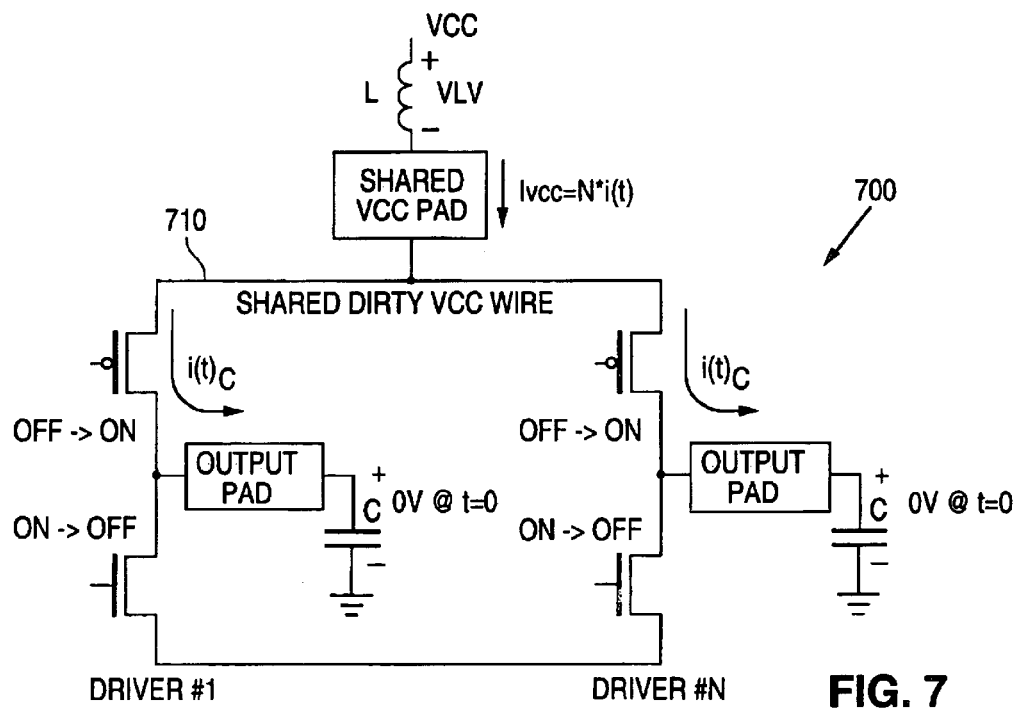
FIG. 7 is a circuit diagram further illustrating the series of output drivers driver#1–driver#N.
Figure 6:
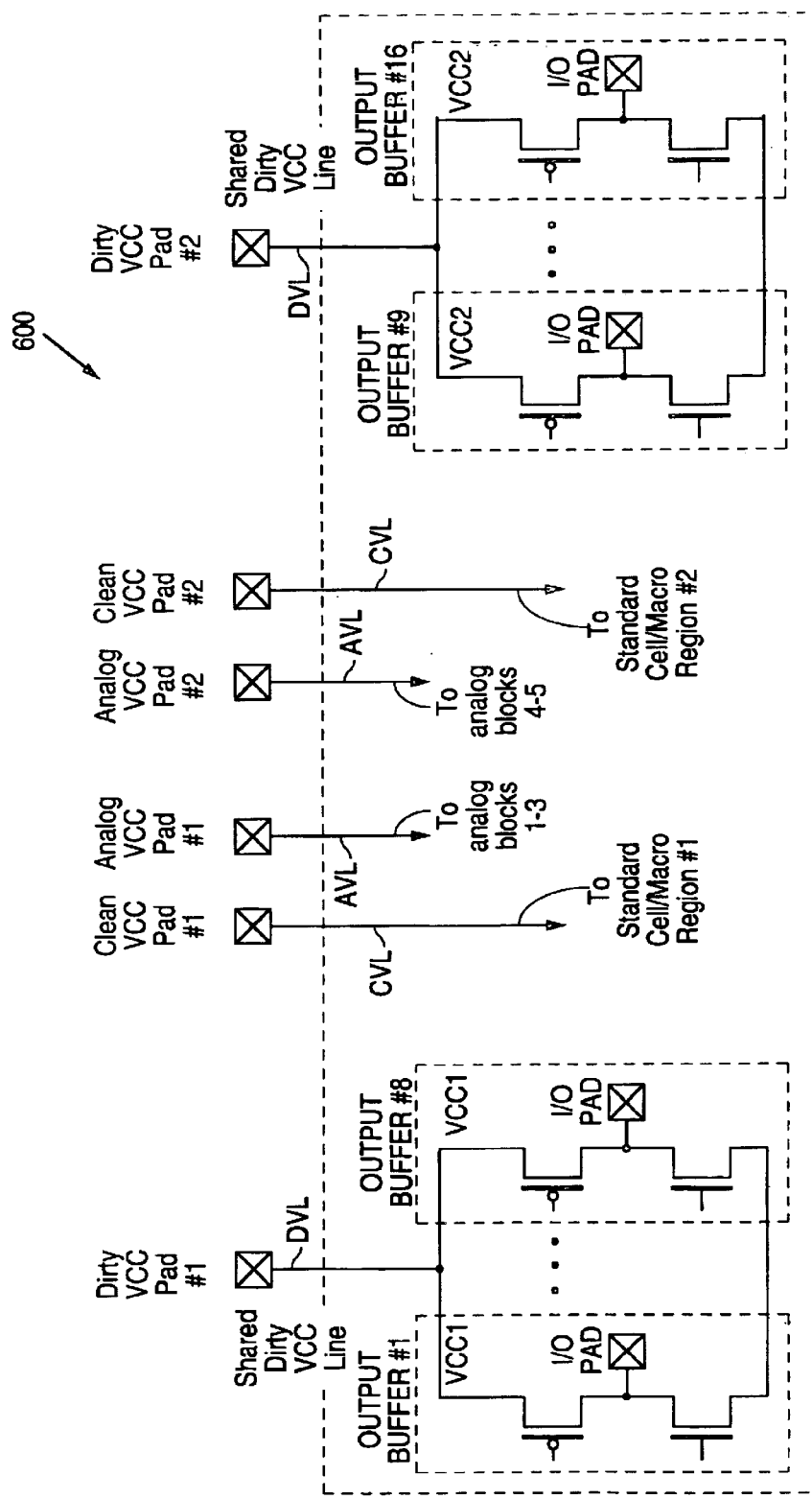
FIG. 6 is a schematic diagram illustrating a portion of a conventional output circuit 600.

To put it another way, during a high current (approximately 1.5 A) ESD event, the forward voltage drop across diodes 800 and 1000 will be 3 to 4 times lower than the forward voltage drop across comparably sized lateral PNP/NPN parasitic transistors, such as Q1 and Q2 shown in FIG. 3.

This lower forward voltage drop allows more voltage to be dropped across the ESD positive ring wire and the ESD negative ring wire, which are part of the ESD protection circuit. Thus, the width of the ESD positive ring wire and the ESD negative ring wire can be reduced, saving additional chip area.

7.3 Lateral Diode Operation

As shown in FIG. 12, during normal (non-ESD) circuit operation, diodes 800 and 1000 simply function as rectifiers, isolating each I/O pad from a common positive ESD ring 1210 and a common negative ESD ring 1220. During an ESD event, diodes 800 and 1000 must conduct current in the forward direction only—i.e. they do not have to break down in the reverse direction. Thus the reverse breakdown voltage of diodes 800 and 1000 is not important—it can be any value above the maximum VCC.

(The reverse breakdown voltage, however, is important in terms of leakage current. Although a P+/NLDD diode has a slightly lower forward resistance in comparison to a P+/N− well diode, the P+/NLDD diode generally has a much lower reverse breakdown voltage. This lower reverse breakdown voltage can cause excessive leakage current to flow, especially at elevated temperatures. Thus, depending upon processing variations, a P+/N− well diode may actually provide the best solution in many cases.)

Figure 13:
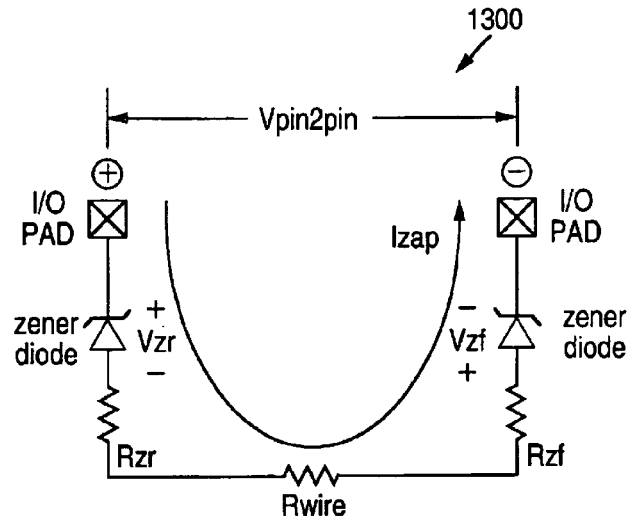
FIG. 13 is a schematic diagram illustrating a conventional zener diode based ESD protection circuit 1300.

Never having to break down in the reverse direction constitutes a very significant advantage in comparison to ESD protection circuits which are based upon the use of zener diodes. FIG. 13 shows a schematic diagram which illustrates a conventional ESD protection circuit 1300, based upon the use of zener diodes.

As shown in FIG. 13, the peak pin-to-pin voltage drop Vpin2pin, between the two pads experiencing an ESD event, is defined by EQ. 5 to be:

$$Vpin2pin = Vzr + (Izap)(Rzr + Rwire + Rzf) + Vzf \qquad \text{EQ. 5}$$

where Vzr represents the zener reverse breakdown voltage drop under low reverse current conditions, Izap represents the peak ESD current for the human body model (approximately 1.5 A), Rzr represents the zener reverse resistance under peak ESD current conditions, Rwire represents the equivalent resistance of the ring wire between the two pads experiencing an ESD event, Rzf represents the zener forward resistance under peak ESD current conditions, and Vzf represents the zener forward voltage drop under low forward current conditions.

As shown by EQ. 5, the value of the zener reverse breakdown voltage Vzr is critical. If this value is too high, the voltage drop Vpin2pin between the two pads experiencing an ESD event will be too high, causing gate oxide failure.

On the other hand, if the breakdown voltage Vzr is too low, excessive leakage current will result. Of course, the breakdown voltage Vzr must be comfortably above the maximum value of VCC, else the ESD protection circuit will conduct current during normal circuit operation (a catastrophic event).

In summary, as shown in FIG. 13, conflicting requirements on the value of the breakdown voltage Vzr make it very difficult to build a production worthy ESD protection circuit using zener diodes which must break down in the reverse direction.

7.4 Advantages of the Present Invention

One advantage of diodes 800 and 1000 is that they are essentially cost-free from a chip manufacturing standpoint because they can be formed without using any additional masks or process steps. This is a significant advantage. In addition, these diodes also reduce die size because they consume considerably less area than the lateral PNP/NPN transistors which they replace.

Another advantage of diodes 800 and 1000 is that they reduce I/O pin capacitance from approximately 6–12 pf down to approximately 2–3 pf (a very significant advantage for switchable high-impedance bus pins). In addition, diodes 800 and 1000 also reduce input leakage current due to their small PN junction periphery/area. Another advantage of diodes 800 and 1000 is that they are highly resistant to ESD damage because they do not contain any thin oxide.

7.5 Lateral Diode Improvement with Process Shrinks

As CMOS design rules shrink, the gate oxide breakdown voltage of the CMOS transistors (PMOS and NMOS) decreases. This decrease requires that the voltage drop across the ESD protection diodes must be kept very low. Thus another important advantage of diodes 800 and 1000 is that they scale very well with respect to CMOS design rule shrinks because they conduct current in the forward direction only. This results in a low forward voltage drop which is not adversely affected by the shrinking CMOS design rules.

Zener based protection circuits, such as the one shown in FIG. 13, do not scale very well with respect to CMOS design rule shrinks because the reverse zener diode voltage is usually quite high (approximately 6.8V), and it cannot be decreased by altering the zener diode periphery/area.

This is a great disadvantage because the minimum theoretical voltage drop between two pins experiencing an ESD event, ignoring the voltage drop in the on-chip wires, is very high (approximately 0.7V+6.8V=7.5V). This requires that the voltage drop across the on-chip wires must be very low, increasing the required wire width, which increases the die size. (For example, the gate oxide breakdown voltage for 100 angstrom gate oxide is approximately 10V. Thus the maximum voltage drop allowed across the on-chip wires is only 10V−7.5V=2.5V).

7.6 Protection of Multiple Isolated VCC Pins and Multiple Isolated Ground Pins An additional advantage of the present invention is that diodes 800 and 1000 allow multiple isolated ground lines and multiple isolated VCC lines to be ESD protected. This is possible as shown in FIG. 14.

Figure 14:
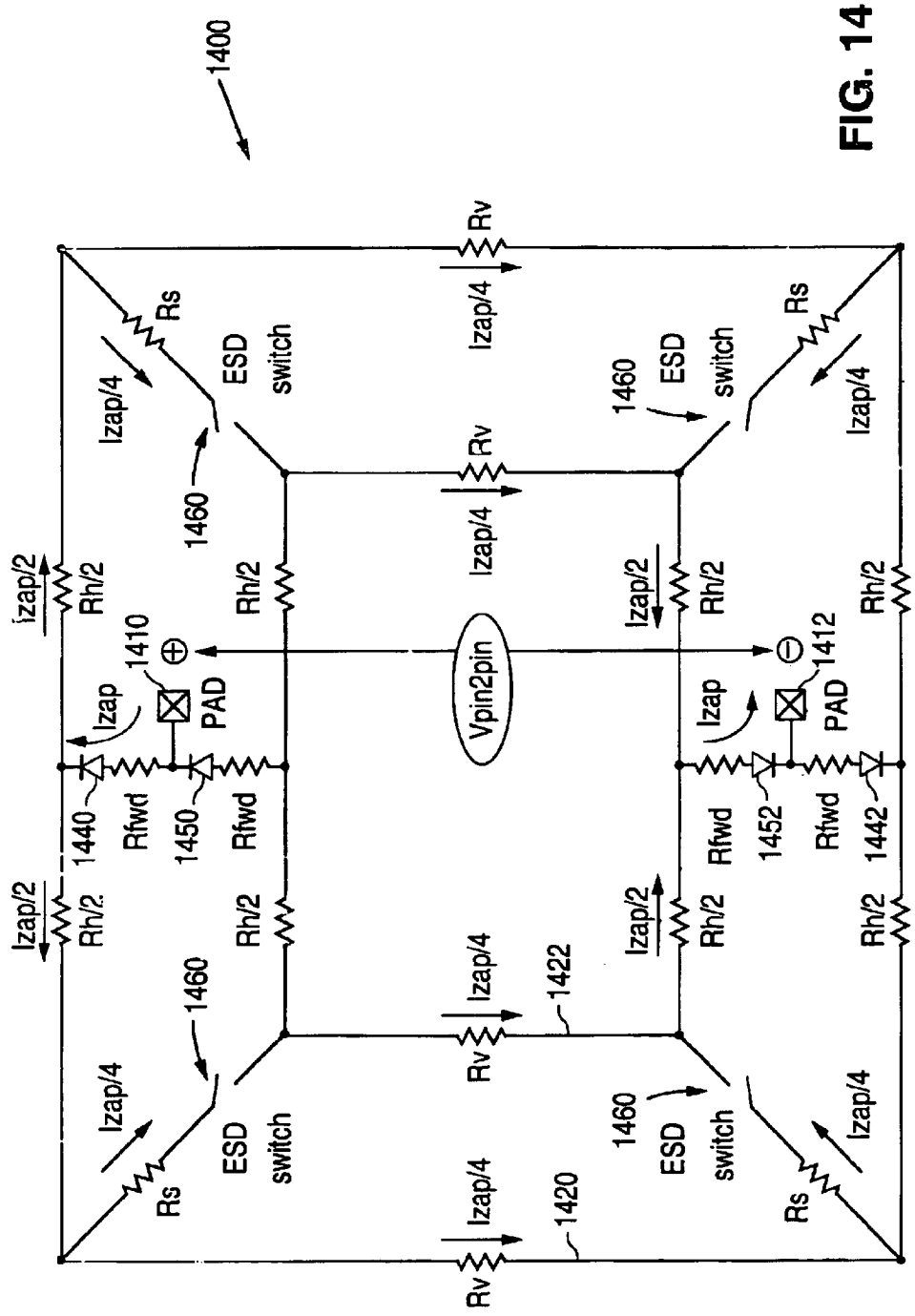
FIG. 14 is a circuit diagram illustrating a chip 1400 in accordance with the present invention.

FIG. 14 shows a circuit diagram which illustrates a chip 1400 in accordance with the present invention. As shown in FIG. 14, chip 1400 includes a plurality of pads, such as first and second pads 1410 and 1412, and an ESD protection circuit which includes an ESD positive ring 1420 and an ESD negative ring 1422.

Furthermore, the ESD protection circuit also includes a plurality of floating upper ESD diodes, such as 1440 and 1442, which are formed in accordance with the present invention. Additionally, the ESD protection circuit also includes a plurality of floating lower ESD diodes, such as 1450 and 1452, which are formed in accordance with the present invention.

Figure 2:
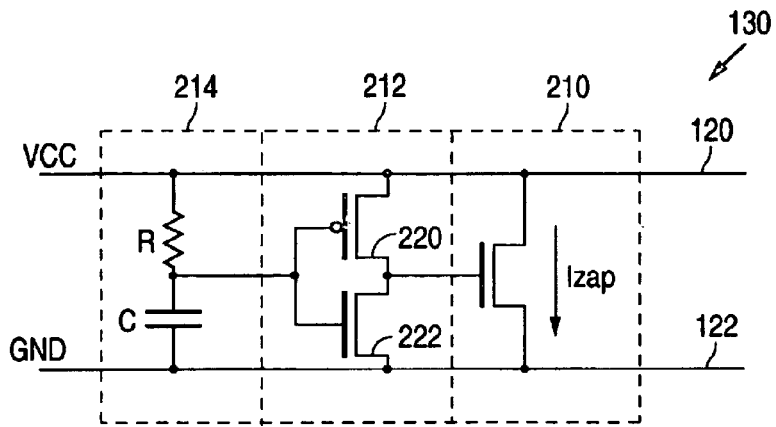
FIG. 2 is a schematic diagram illustrating a conventional ESD switch 130.

The ESD protection circuit includes a plurality of ESD switches 1460, such as ESD switch 130 shown in FIG. 2. In accordance with the present invention, switches 1460 may be placed in the corners of chip 1400, and/or uniformly spaced along all four sides of chip 1400. Switches 1460 are connected to positive ESD ring 1420 and negative ESD ring 1422. As shown in FIG. 14, both of these rings traverse the entire periphery (all 4 sides) of chip 1400.

The concentric metal rings 1420 and 1422 form part of a low impedance ESD current path between the two pads experiencing an ESD event. (These closed wire rings pass through each I/O cell region). As shown by the current arrows in FIG. 14, different fractions of the ESD current Izap flow through various portions of the concentric rings 1420 and 1422.

The two pads experiencing the ESD event in FIG. 14 are located diametrically opposite each other on the chip. This produces the worst case (maximum) IR drop in concentric metal rings 1420 and 1422. Note that the ESD currents shown in FIG. 14 do not flow through all portions of concentric rings 1420 and 1422.

The DC value Vpin2pin, of the peak voltage drop between the two pads experiencing the ESD event, is defined by EQ. 6 as:

$$Vpin2pin = (Izap)[2*Rfwd + (Rh/2) + (Rv/4) + (Rs/4)] + 2*Vfwd \qquad \text{EQ. 6}$$

where Izap represents the peak current for the human body model (approximately 1.5 A), Rfwd represents the forward resistance of a floating diode, such as diodes 1440, 1442, 1450, and 1452, Rh represents the horizontal wire resistance of positive and negative ring wires 1420 and 1422 at the top and bottom of the chip, Rv represents the vertical wire resistance of positive and negative ring wires 1420 and 1422 at the left and right sides of the chip, Rs represents the peak value of the resistance of an ESD switch 1460, and Vfwd represents the forward voltage drop across a floating diode, such as diodes 1440, 1442, 1450, and 1452, at low forward current.

Although the DC voltage Vpin2pin is only an approximation, it comes reasonably close to predicting the actual result of an ESD transient simulation. EQ. 6 indicates that the corner switch resistance is effectively divided by four because, in the example shown in FIG. 14, four switches 1460 are used instead of one.

This reduction in equivalent switch resistance, in those cases where more than one switch 1460 is being employed, is extremely important. Note that if switches 1460 are placed in the four corners of the die (as shown in FIG. 14), they do not effectively occupy any chip area because the corner regions would otherwise go unused.

If desired, the ESD negative ring wire 1422 shown in FIG. 14 may be connected to any one of the isolated ground pins. This will not result in making an electrical connection between two or more of these pins, which, in the general case, must remain isolated from each other on-chip. Similarly, the ESD positive ring wire 1420 shown in FIG. 14 may be connected to any one of the isolated Vcc pins. This will not result in making an electrical connection between two or more of these pins, which, in the general case, must also remain isolated from each other on-chip.

The main advantage of making the above connections is that the ESD switch 130 shown in FIG. 2 will not be at risk for accidental turn-on during normal (non-ESD) circuit operation.

If the ESD ring wires 1420 and 1422 in FIG. 14 are left floating, the ESD switch shown in FIG. 2 must be configured such that it will not turn on during normal (non-ESD) circuit operation.

7.7 Reducing ESD Pin-to-Pin Voltage Drop for Large Chips (Without Increasing ESD Diode Size)

For chips which have X, Y dimensions that only moderately exceed those originally planned for, it might at first appear that it would impossible to ESD protect such chips without having to increase the size of the floating diodes (1440, 1450, 1442 and 1452 in FIG. 14).

This is not true, however, when dealing with large chips which are not I/O limited. Thus, for chips which are not limited, additional switches 1460 can be placed within the positive and negative ESD rings, without increasing the die size. This results in improved ESD performance without having to modify (increase the size of) the diode layouts. This advantage can be obtained, as described below, using a technique which is part of the present invention.

Figure 15:
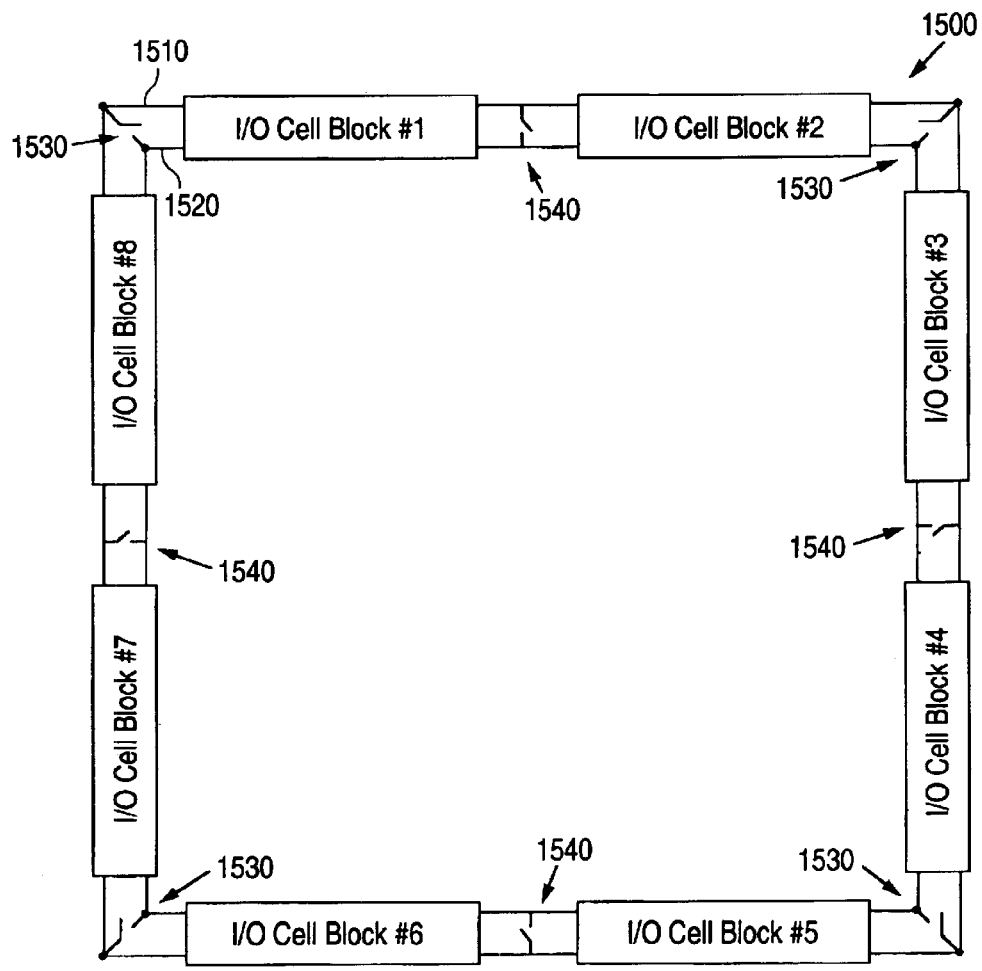
FIG. 15 is a circuit diagram illustrating a chip 1500 in accordance with the present invention.

FIG. 15 shows a circuit diagram which illustrates a chip 1500 in accordance with the present invention. As shown in FIG. 15, chip 1500 includes an ESD positive ring 1510, an ESD negative ring 1520 and four ESD switches 1530, such as ESD switch 130 shown in FIG. 2. Four ESD switches 1530 are placed in the corners as shown in FIG. 15, and four ESD switches 1540, such as ESD switch 130 of FIG. 2, are placed in the middle of each side of chip 1500. As shown in FIG. 15, all switches 1530 and 1540 are connected between the positive and negative ESD rings 1510 and 1520.

Switches 1540 decrease the effective switch resistance (Rs) in EQ. 6. In addition, the effective wire resistance (Rh and Rv in EQ. 6) is also reduced because the ESD current Izap can flow through additional parallel wire paths created by the additional ESD switches 1540.

In summary, for large 'core limited' chips, the additional switches 1540 shown in FIG. 15 can decrease the ESD pin-to-pin voltage drop Vpin2pin, resulting in improved ESD performance at no additional cost. An improvement of approximately 10–20 percent can usually be achieved. The exact amount of improvement depends upon the relative voltage drops across each element in the ESD current path (diodes, switches and metal rings).

FIG. 16 shows a circuit diagram which illustrates a chip 1600 that employs an alternative form of the present invention. As shown in FIG. 16, chip 1600 includes a single ESD negative ring 1610, a plurality of pads 1620, and a plurality of ESD switches 1625, such as ESD switch 130 shown in FIG. 2. ESD negative ring 1610 encircles the entire chip 1600, passing through all of the I/O cells. In addition, chip 1600 also includes a plurality of floating lateral clamp diodes in accordance with the present invention, such as lower ESD diodes 1630 and upper ESD diodes 1635.

As shown in FIG. 16, the anodes of all lower ESD diodes 1630 are connected to the ESD negative ring 1610. It is important to note that chip 1600 also contains one or more positive ESD wires 1640–1647, which are also labeled as ESD Vcc1–ESD Vcc8 in FIG. 16. As shown in FIG. 16, ESD positive wires 1640–1647 are electrically isolated from each other.

The cathodes of all upper ESD diodes 1635 in FIG. 16 are connected to the isolated ESD positive wires 1640–1647. Each ESD positive wire 1640–1647 is also connected to one or more ESD switches 1625. As shown in FIG. 16, one side of each ESD switch 1625 is also connected to the ESD negative ring 1610.

If any one of the I/O pads 1620 in FIG. 16 is zapped positively with respect to a second I/O pad 1620, an ESD current will flow between the two I/O pads being zapped. Furthermore, the ESD current path will always contain one upper ESD diode 1635, one or more ESD switches 1625 connected in parallel, and one lower ESD diode 1630. Since the aforementioned ESD current path elements are similar to the ESD current path elements shown in FIG. 14, the ESD performance of the circuit shown in FIG. 16 will be roughly comparable to that of the circuit shown in FIG. 14. The only disadvantage of the FIG. 16 circuit is that it contains additional wire resistance in the ESD current path because it lacks a continuous ESD positive ring in parallel with the ESD negative ring 1610. Thus all of the ESD current must flow through the single ESD negative ring 1610, increasing the voltage drop between the two I/O pins being zapped.

Nevertheless, the FIG. 16 circuit can be used in those cases where electrical noise coupling between I/O pads must be kept to an absolute minimum. Thus, because the FIG. 16 circuit does not contain an ESD positive ring which is common to all I/O pads, the pad to pad electrical noise coupled through this common ESD positive ring is eliminated.

7.8 Parameters which Affect ESD Performance

ESD performance is affected by design parameters and process parameters. The former are under the direct control of the circuit design engineer, whereas the latter are not.

As implied by EQ. 6, the performance of an ESD protection circuit (i.e. the value of Vpin2pin) will be affected by the size (P+ periphery) of the lateral ESD diodes (this determines Rfwd), and the transistor size (W/L ratio) used for the ESD corner switches (this determines Rs).

In addition, the ESD performance is also affected by the width of the ESD negative ring metal and the width of the ESD positive ring metal (this partially determines Rh and Rv), the chip X,Y dimensions (this partially determines Rh and Rv), and the ESD zap voltage (this determines the value of Izap).

In most cases the height of the lateral ESD diodes and the width of the concentric metal rings (negative ESD ring and positive ESD ring) will be the same. This relationship exists because the upper and lower ESD diodes are usually built directly underneath the ESD positive ring metal and the ESD negative ring metal, respectively. This configuration minimizes the chip area required to implement ESD protection. Therefore, increasing the diode height will also increase the width of the metal ESD rings. This causes ESD performance to rapidly increase because two ESD design parameters are being enhanced at the same time.

Conversely, decreasing the diode height will also decrease the width of the metal ESD rings. This causes ESD performance to quickly decrease because two ESD design parameters are being deteriorated at the same time.

The process parameters which affect ESD performance include the number of metal layers used to implement the concentric ESD rings (ESD positive ring and ESD negative ring), the metal ohms per square, and the minimum gate oxide breakdown voltage. Other process parameters include the forward voltage drop across a lateral ESD diode at low forward current (Vfwd), and the PVT (process, voltage, temperature) variations.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A semiconductor chip having a substrate of a first conductivity type, the chip comprising:
   a plurality of pads;
   an electrostatic discharge (ESD) negative ring:
   a plurality of ESD positive lines, the plurality of positive lines not being electrically connected to each other, none of the positive lines being directly connected to a pad;
   a plurality of ESD switches connected to the ESD positive lines and the ESD negative ring so that each ESD switch is connected to a positive line and the ESD negative ring;
   a plurality of first diodes connected to the pads so that each first diode is connected to a pad and the negative ring; and
   a plurality of second diodes connected to the pads so that each second diode is connected to a pad and a positive line.

2. The chip of claim 1 wherein an ESD current flows from a first pad through a second diode to an ESD positive line, through a switch to the ESD negative ring, and through a first diode to a second pad during an ESD event.

3. The chip of claim 1 wherein the ESD positive lines are never directly connected to a steady voltage source.

4. The chip of claim 3 wherein each second diode has an anode electrically connected to a pad.

5. The chip of claim 4 wherein a positive line is connected to the negative ring via a plurality of ESD switches.

6. The chip of claim 1 wherein each second diode has an anode electrically connected to a pad.

7. The chip of claim 6 wherein a positive line is connected to the negative ring via a plurality of ESD switches.

8. The chip of claim 1 wherein a positive line is connected to the negative ring via a plurality of ESD switches.

9. The chip of claim 1 wherein a second diode is directly connected to a pad and directly connected to a positive line.

10. The chip of claim 1 wherein the ESD negative ring encircles the periphery of the chip.

11. The chip of claim 10 wherein none of the plurality of positive lines encircles the periphery of the chip.

12. The chip of claim 1 wherein a switch of the plurality of switches includes a transistor connected to a positive line and the negative ring.

13. A semiconductor chip having a substrate of a first conductivity type, the chip comprising:
    a plurality of pads;
    an electrostatic discharge (ESD) negative ring:
    a plurality of ESD positive lines, the plurality of positive lines not being electrically connected to each other, none of the positive lines being directly connected to a pad;
    a plurality of ESD switches connected to the ESD positive lines and the ESD negative ring so that each positive line is connected to the negative ring via an ESD switch;
    a plurality of first diodes connected to the pads so that each first diode is connected to a pad and the negative ring, a first diode of the plurality of first diodes including:
       a plurality of first regions, the plurality of first regions being spaced apart from each other;
       a second region, the plurality of first regions being formed in the second region, the plurality of first regions and the second region having opposite conductivity types, the second region having a dopant concentration; and
       a third region formed in the second region, the third region being spaced apart from each first region, and formed between each adjacent pair of first regions, the third region having a dopant concentration that is higher than the dopant concentration of the second region; and
    a plurality of second diodes connected to the pads so that each second diode is connected to a pad and a positive line.

14. The semiconductor chip of claim 13 wherein the second region is formed in the substrate, the second region and the substrate having opposite conductivity types.

15. The chip of claim 14 wherein the plurality of first regions have a dopant concentration that is higher than the dopant concentration of the substrate.

16. The semiconductor chip of claim 13 and further comprising a fourth region, the second region being formed in the fourth region, the second region and the fourth region having a same conductivity type and different dopant concentrations, the fourth region being formed in the substrate, the fourth region and the substrate having opposite conductivity types.

17. The chip of claim 16 wherein the plurality of first regions have a dopant concentration that is higher than the dopant concentration of the substrate.

18. A semiconductor chip having a substrate of a first conductivity type, the chip comprising:
    a plurality of pads;
    an electrostatic discharge (ESD) negative ring:
    a plurality of ESD positive lines, the plurality of positive lines not being electrically connected to each other;
    a plurality of ESD switches connected to the ESD positive lines and the ESD negative ring so that each ESD switch is connected to a positive line and the ESD negative ring, a switch of the plurality of ESD switches passing a current from a positive line to the negative ring when a voltage on the positive line rises at a first rate;

a plurality of first diodes connected to the pads so that each first diode is connected to a pad and the negative ring; and a plurality of second diodes connected to the pads so that each second diode is connected to a pad and a positive line.

19. The chip of claim 18 wherein the switch blocks a current from flowing from the positive line to the negative ring when a voltage on the positive line rises at a second rate that is different from the first rate.

20. The chip of claim 18 wherein a second diode is forward biased when the voltage on the positive line rises at the second rate.

21. The chip of claim 18 wherein none of the plurality of positive lines encircles the periphery of the chip.

22. The chip of claim 18 wherein a positive line is connected to the negative ring via a plurality of ESD switches.

23. The chip of claim 18 wherein an ESD switch is directly connected to a positive line and the negative ring.

24. The chip of claim 18 wherein a second diode is directly connected to a pad and directly connected to a positive line.

25. A semiconductor chip having a substrate of a first conductivity type, the chip comprising:

a plurality of pads;

an electrostatic discharge (ESD) negative ring:

a plurality of ESD positive lines, the plurality of positive lines not being electrically connected to each other, none of the positive lines being directly connected to a pad;

a plurality of ESD switches connected to the ESD positive lines and the ESD negative ring so that each ESD switch is connected to a positive line and the ESD negative ring;

a plurality of first diodes connected so that each first diode is connected between a pad and the negative ring; and a plurality of second diodes connected so that each second diode is connected between a pad and a positive line.

26. The semiconductor chip of claim 25 wherein an ESD switch is directly connected to a positive line and the negative ring.

27. The semiconductor chip of claim 25 wherein none of the positive lines encircles the periphery of the chip.

28. The chip of claim 25 wherein a second diode is directly connected to a pad and directly connected to a positive line.

29. A semiconductor chip having a substrate of a first conductivity type, the chip comprising:

a plurality of pads;

an electrostatic discharge (ESD) negative ring:

a plurality of ESD positive lines, the plurality of positive lines not being electrically connected to each other, none of the positive lines being directly connected to a pad;

a plurality of ESD switches connected to the ESD positive lines and the ESD negative ring so that each ESD switch is connected to a positive line and the ESD negative ring;

a plurality of first diodes connected so that each first diode is connected between a pad and the negative ring, a first diode of the plurality of first diodes comprising:

a plurality of first regions, the plurality of first regions being spaced apart from each other;

a second region, the plurality of first regions being formed in the second region, the plurality of first regions and the second region having opposite conductivity types, the second region having a dopant concentration; and a third region formed in the second region, the third region being spaced apart from each first region, and formed between each adjacent pair of first regions, the third region having a dopant concentration that is higher than the dopant concentration of the second region; and a plurality of second diodes connected so that each second diode is connected between a pad and a positive line.

30. The semiconductor chip of claim 29 wherein the second region is formed in the substrate, the second region and the substrate having opposite conductivity types.

31. A semiconductor chip having a substrate of a first conductivity type, the chip comprising:

a plurality of pads;

an electrostatic discharge (ESD) negative ring:

a plurality of ESD positive lines, the plurality of positive lines not being electrically connected to each other;

a plurality of ESD switches connected to the ESD positive lines and the ESD negative ring so that each ESD switch is connected to a positive line and the ESD negative ring, a switch of the plurality of ESD switches passing a current from a positive line to the negative ring when a voltage on the positive line rises at a first rate that is faster than a second rate;

a plurality of first diodes connected so that each first diode is connected between a pad and the negative ring; and a plurality of second diodes connected so that each second diode is connected between a pad and a positive line.

32. The chip of claim 31 wherein a second diode is directly connected to a pad and directly connected to a positive line.

33. The semiconductor chip of claim 31 wherein an ESD switch is directly connected to a positive line and the negative ring.

34. The semiconductor chip of claim 31 wherein none of the positive lines encircles the periphery of the chip.

35. A semiconductor chip having a substrate of a first conductivity type, the chip comprising:

a plurality of pads;

an electrostatic discharge (ESD) negative ring:

a plurality of ESD positive lines, the plurality of positive lines not being electrically connected to each other;

a plurality of ESD switches connected to the ESD positive lines and the ESD negative ring so that each ESD switch is connected to a positive line and the ESD negative ring, a switch of the plurality of ESD switches passing a current from a positive line to the negative ring when a voltage on the positive line rises at a first rate that is faster than a second rate;

a plurality of first diodes connected so that each first diode is connected between a pad and the negative ring, a first diode of the plurality of first diodes comprising:

a plurality of first regions, the plurality of first regions being spaced apart from each other;

a second region, the plurality of first regions being formed in the second region, the plurality of first regions and the second region having opposite conductivity types, the second region having a dopant concentration; and a third region formed in the second region, the third region being spaced apart from each first region, and formed between each adjacent pair of first regions, the third region having a dopant concentration that is higher than the dopant concentration of the second region; and a plurality of second diodes connected so that each second diode is connected between a pad and a positive line.

36. The semiconductor chip of claim 35 wherein the second region is formed in the substrate, the second region and the substrate having opposite conductivity types.

37. A semiconductor chip having a substrate of a first conductivity type, the chip comprising:

a plurality of pads;

an electrostatic discharge (ESD) negative ring:

a plurality of ESD positive lines, the plurality of positive lines not being electrically connected to each other;

a plurality of ESD switches connected to the ESD positive lines and the ESD negative ring so that each positive line is connected to the negative ring via an ESD switch;

a plurality of first diodes connected to the pads so that each first diode is connected to a pad and the negative ring, a first diode of the plurality of first diodes comprising:

a plurality of first regions, the plurality of first regions being spaced apart from each other;

a second region, the plurality of first regions being formed in the second region, the plurality of first regions and the second region having opposite conductivity types, the second region having a dopant concentration; and a third region formed in the second region, the third region being spaced apart from each first region, and formed between each adjacent pair of first regions, the third region having a dopant concentration that is higher than the dopant concentration of the second region; and a plurality of second diodes connected to the pads so that only one second diode is connected between a pad and a positive line.

38. A semiconductor chip having a substrate of a first conductivity type, the chip comprising:

a plurality of pads;

an electrostatic discharge (ESD) negative ring:

a plurality of ESD positive lines, the plurality of positive lines not being electrically connected to each other;

a plurality of ESD switches connected to the ESD positive lines and the ESD negative ring so that each positive line is connected to the negative ring via an ESD switch, a switch of the plurality of ESD switches passing a current from a positive line to the negative ring when a voltage on the positive line rises at a first rate;

a plurality of first diodes connected to the pads so that each first diode is connected to a pad and the negative ring, a first diode of the plurality of first diodes comprising:

a plurality of first regions, the plurality of first regions being spaced apart from each other;

a second region, the plurality of first regions being formed in the second region, the plurality of first regions and the second region having opposite conductivity types, the second region having a dopant concentration; and a third region formed in the second region, the third region being spaced apart from each first region, and formed between each adjacent pair of first regions, the third region having a dopant concentration that is higher than the dopant concentration of the second region; and a plurality of second diodes connected to the pads so that only one second diode is connected between each pad and each positive line.

* * * * *